(12) United States Patent
Nakamura et al.

(10) Patent No.: US 9,224,936 B2
(45) Date of Patent: Dec. 29, 2015

(54) THERMOELECTRIC CONVERSION DEVICE

(75) Inventors: Yasunobu Nakamura, Tokyo (JP); Akihiro Kirihara, Tokyo (JP); Shinichi Yorozu, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/123,956

(22) PCT Filed: Jun. 6, 2012

(86) PCT No.: PCT/JP2012/064514
§ 371 (c)(1),
(2), (4) Date: Dec. 4, 2013

(87) PCT Pub. No.: WO2012/169509
PCT Pub. Date: Dec. 13, 2012

(65) Prior Publication Data
US 2014/0096810 A1    Apr. 10, 2014

(30) Foreign Application Priority Data

Jun. 7, 2011   (JP) ................. 2011-127108

(51) Int. Cl.
*H01L 35/30* (2006.01)
*H01L 35/32* (2006.01)
*H01L 37/00* (2006.01)

(52) U.S. Cl.
CPC ............ *H01L 35/32* (2013.01); *H01L 37/00* (2013.01)

(58) Field of Classification Search
None
See application file for complete search history.

(56) References Cited

U.S. PATENT DOCUMENTS

| 2004/0089336 | A1* | 5/2004 | Hunt ..................... 136/205 |
| 2010/0229910 | A1* | 9/2010 | Paik et al. ............. 136/236.1 |
| 2010/0276770 | A1* | 11/2010 | Uchida et al. ........... 257/421 |
| 2011/0084349 | A1 | 4/2011 | Uchida et al. |
| 2013/0104948 | A1* | 5/2013 | Saitoh ................. H01L 37/00 136/200 |

FOREIGN PATENT DOCUMENTS

| JP | 2009-130070 A | 6/2009 |
| JP | 2010-040998 A | 2/2010 |
| JP | 4457795 A | 4/2010 |
| JP | 2010-199276 A | 9/2010 |
| JP | 2011-249746 A | * 12/2011 |
| JP | 2011-249746 A | 12/2011 |
| WO | WO 2009/151000 A1 | 12/2009 |

OTHER PUBLICATIONS

International Search Report dated Jun. 3, 2012 in International Patent Application Publication No. PCT/JP2012/064514.

(Continued)

*Primary Examiner* — Eli Mekhlin
(74) *Attorney, Agent, or Firm* — McGinn IP Law Group PLLC

(57) ABSTRACT

A thermoelectric conversion device includes: a substrate; two magnetic layers having a fixed magnetization direction with respect to the substrate; and at least one electrode including a material having a spin orbit interaction, wherein a gap (or dielectric layer of low thermal conductivity) is provided between the magnetic layers. A thickness of the gap (or dielectric layer) is of a distance within the range at that a magnetic dipole interaction is exerted, and a film thickness of the magnetic layers is of about a characteristic length determined by diffusion or the like of a magnetic excitation.

19 Claims, 20 Drawing Sheets

(56) References Cited

OTHER PUBLICATIONS

K.Uchida et al., "Spin Seebeck Insulator", 2010, Nature Materials 9, p. 894-897.

K.Uchida et al., "Observation of Longitudinal Spin-Seebeck Effect in Magnetic Insulators", 2010, Appl. Phys. Lett.97, 172505.

T. Schneider et al, "Spin-Wave Tunneling through a Mechanical Gap", 2010, Europhysics Letters 90, 27003.

* cited by examiner

THERMOELECTRIC CONVERSION DEVICE

DESCRIPTION OF RELATED APPLICATION

This application claims the benefit of Japanese Patent Application No. 2011-127108, filed Jun. 7, 2011, which is hereby incorporated by reference herein in its entirety.

TECHNICAL FIELD

This invention relates to a thermoelectric conversion device.

BACKGROUND

In order to establish a sustainable society, approaches to environmental issue or energy issue have been taken actively. Under these circumstances, expectations for thermoelectric conversion technology have increased. Since heat is the most common energy source that can be recovered from various situations such as body temperature, solar heat, engine, industrial exhaust heat and so forth, for the purpose of achieving high-efficiency energy utilization in a low carbon society, and feeding power to a ubiquitous terminal, a sensor and so forth, a thermoelectric conversion is expected to become increasingly important.

Generally, a bulk type thermoelectric device in which a thermoelectric couple module structure is built by processing and jointing a sintered body of a thermoelectric semiconductor material such as $Bi_2Te_3$ is commonly used. Recently, a thin film type thermoelectric device in which a thermoelectric semiconductor thin film is formed on a substrate using sputtering or the like has been developed, and the device is gathering attention.

Advantages of thin film thermoelectric conversion device are enumerated as follows, for example:

(A) small and lightweight, (B) high productivity owing to batch deposition of a film with a large area by sputtering, printing and so forth, (C) being able to reduce cost by using an inexpensive substrate, (D) being able to implement a flexible thermoelectric device by adopting a substrate with high flexibility, and so forth.

Some methods using coating or printing are known as a method for manufacturing a thin film thermoelectric conversion device.

For instance, in Patent Literature 1, there is disclosed a method comprising coating a material obtained by mixing a powdered $Bi_2Te_3$ material with a binder so as to be made pasty on a substrate by a screen printing method or the like to form a thermoelectric device pattern.

In Patent Literature 2, there is disclosed a method for manufacturing a thermoelectric conversion module in which a thermoelectric device is formed by pattern-printing inks including a thermoelectric semiconductor material and an electrode material using inkjet method.

Further, In Patent Literature 3, there is disclosed a method in which, in a thermoelectric conversion device including a p-type semiconductor element, an n-type semiconductor element, and an insulator, at least one of a p-type semiconductor element and an n-type semiconductor element includes an organic semiconductor material, and the p-type semiconductor element and the n-type semiconductor element are formed by coating or printing.

It is also noted that there is a problem in which it is difficult for a thin film type thermoelectric device to generate and hold a temperature difference between a front surface and a rear surface of the thin film (thermoelectric semiconductor film) due to thickness of the thin film. In many cases for power generation utilization, a thermoelectric conversion using a temperature difference (temperature gradient) in a surface-normal direction of a thin film including a thermoelectric material is needed.

In a thin film thermoelectric conversion device, in the case where a thermoelectric semiconductor film is too thin, a thermal insulation is not sufficient and hence it is difficult to hold a temperature difference between a front surface and a back surface, thereby an effective power generation being disabled.

Therefore, a thickness of a thermoelectric semiconductor film preferably is of several tens of micron meter or more, for instance.

However, it is difficult to manufacture such a thick film thermoelectric couple structure by patterning using coating or printing process or the like. As a result, a tradeoff occurs between high efficient conversion and productivity.

In recent years, there has been found a spin Seebeck effect in which flows of electron spin are generated by setting a temperature gradient in a magnetic material. For instance, in Patent Literature 4 and non-Patent Literatures 1 and 2, there are disclosed thermoelectric conversion devices based on the spin Seebeck effect. These devices extract an angular momentum flow (spin flow) generated by the sin Seebeck effect as a current (electromotive force) by an inverse spin Hall effect (an effect in which when a spin flow is made to flow, a current flows in a direction perpendicular to the spin flow).

A thermoelectric conversion device disclosed in Patent Literature 4 is arranged by a ferromagnetic layer and a metal electrode deposited by a sputtering method. When a temperature gradient is given in parallel to a surface of the ferromagnetic layer, a spin flow is induced along a direction of the temperature gradient by the spin Seebeck effect, and with the induced spin flow, a potential difference is generated across both ends of the metal electrode by an inverse spin Hall effect in the metal electrode contacted with the magnetic layer, the potential difference being able to be extracted to outside as a current. This allows a temperature difference based power generation extracting an electric power from a heat to be realized.

In thermoelectric conversion devices disclosed in non-Patent Literatures 1 and 2, thermoelectric conversion devices are formed by a magnetic insulator and a metal electrode.

When the spin Seebeck effect is used, a complicated thermoelectric couple structure is necessitated. Thus, the above-mentioned problem regarding patterning of the thermoelectric couple structure is solved and it can be expected that thin film thermoelectric conversion facilitating a low cost and a large area is realized.

With a thermoelectric module using the spin Seebeck effect. an electric conductive portion (electrode) and a thermal conductive portion (magnetic material) are able to be designed independently.

Thus, a high efficient thermoelectric conversion device having the following structure is expected to be designed:

an electric conductivity being large (an ohmic loss being small); and a thermal conductivity being small (being able to hold a temperature difference between a front surface and a back surface).

CITATION LIST

Patent Literature

[PTL 1]
Japanese Patent No. JP4457795
[PTL 2]
Japanese Patent Kokai Publication No. JP2010-40998A
[PTL 3]
Japanese Patent Kokai Publication No. JP2010-199276A
[PTL 4]
Japanese Patent Kokai Publication No. JP2009-130070A
[NPL 1]
K. Uchida et al., "Spin Seebeck Insulator", 2010, Nature Materials 9, p. 894-897
[NPL 2]
K. Uchida et al., "Observation of Longitudinal Spin-Seebeck Effect in Magnetic Insulators", 2010, Appl. Phys. Lett. 97, 172505
[NPL 3]
T. Schneider et al, "Spin-Wave Tunneling through a Mechanical Gap", 2010, Europhysics Letters 90, 27003

SUMMARY

The analyses of the related arts are presented below.

There is an issue in which a thermoelectric conversion device using the spin Seebeck effect in accordance with the related arts has not yet had a sufficiently large thermoelectric conversion performance index.

As a performance index of a thermoelectric conversion device, a magnitude of a voltage $\Delta V$ generated across both ends of the device (both ends of an electrode) for a given heat flow amount $\Delta Q$ is shown as an example.

$\Delta V/\Delta Q$ that is a ratio of $\Delta Q$ and $\Delta V$, with the use of a thermal conductivity of the thermoelectric conversion device $\kappa=\Delta Q/\Delta T$, and a thermoelectric power $S=\Delta V/\Delta T$, can be represented as follows, $$S/\kappa \quad (1)$$

In order to achieve a large performance index $S/\kappa$, it is necessary to increase the thermoelectric power $S$ and also to reduce the thermal conductivity $\kappa$.

However, for example, in a thermoelectric or a spin thermoelectric conversion device as illustrated in FIG. 19, a homogeneous material is used between a high temperature side and a low temperature side of a thermoelectric material layer or a ferromagnetic material layer. Thus, $S/\kappa$ depends on characteristics proper to the thermoelectric material or the spin thermoelectric material. It is noted that FIG. 19 is a diagram explaining one example of a typical configuration of a thermoelectric conversion device of the related art using the spin Seebeck effect.

It is difficult to increase the performance index $S/\kappa$ by suppressing (reducing) only the thermal conductivity $\kappa$. It is noted that a structure illustrated in FIG. 19 comprises: a magnetic layer 2 with a film thickness t on a substrate 1; and a metal electrode 3 on the magnetic layer 2 that is magnetized in-plane in an arrow direction (direction perpendicular to an electromotive force $\Delta V$).

FIG. 20 is a diagram illustrating an aspect of local temperature distribution of a lattice and a spin in a thermoelectric or a spin thermoelectric conversion device as illustrated in FIG. 19. An abscissa of FIG. 20 represents a position; an origin (z=0) is z=0 at a interface (contact surface) between the magnetic layer 2 and the substrate 1 in FIG. 19; z=t is z=t (film thickness of the magnetic layer 2) at a interface (contact surface) between the magnetic layer 2 and the metal electrode 3. An ordinate of FIG. 20 represents a temperature difference $\Delta T$.

A lattice temperature distribution is determined mainly by a thermal conductivity of a phonon (a quantized lattice vibration of a crystal, also referred to as a sound quantum, or an acoustic quantum), whereas a spin temperature is determined by a distribution of a magnon (a quasi-particle that is a quantized spin wave) in a magnetic material.

A spin injection from the magnetic layer 2 to the metal electrode 3 occurs by a spin Seebeck effect due to a temperature difference $\Delta T_{mp}$ between a lattice temperature (phonon temperature) and a magnon temperature, which occurs at a interface (z=t in FIG. 20) between the magnetic layer 2 and the metal electrode 3 in FIG. 19. A voltage $\Delta V$ is generated across both ends of the metal electrode 3 by an inverse spin Hall effect within the metal electrode 3.

The present invention has been made in view of the above mentioned issues, and one of main objects is to provide a thermoelectric conversion that is able to increase a performance index.

The present invention is summarized below, though not limited thereto.

According to the present disclosure, there is provided a thermoelectric conversion device comprising:

a first magnetic layer and a second magnetic layer spaced by a predetermined gap therebetween along a surface-normal direction thereof; and a first electrode including a material having a spin orbit interaction, the first electrode arranged in contact with one surface of at least one of the first and the second magnetic layers, the first and the second magnetic layers each having a magnetization direction substantially perpendicular to a direction of an electromotive force induced in the first electrode, the electromotive force corresponding to a temperature difference between the first magnetic layer and the second magnetic layer along a surface-normal direction thereof being extracted from the first electrode.

According to the present disclosure, it is possible to increase a performance index of a thermoelectric conversion device.

Still other features and advantages of the resent invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

MODES FOR CARRYING OUT THE INVENTION

Figure 1:
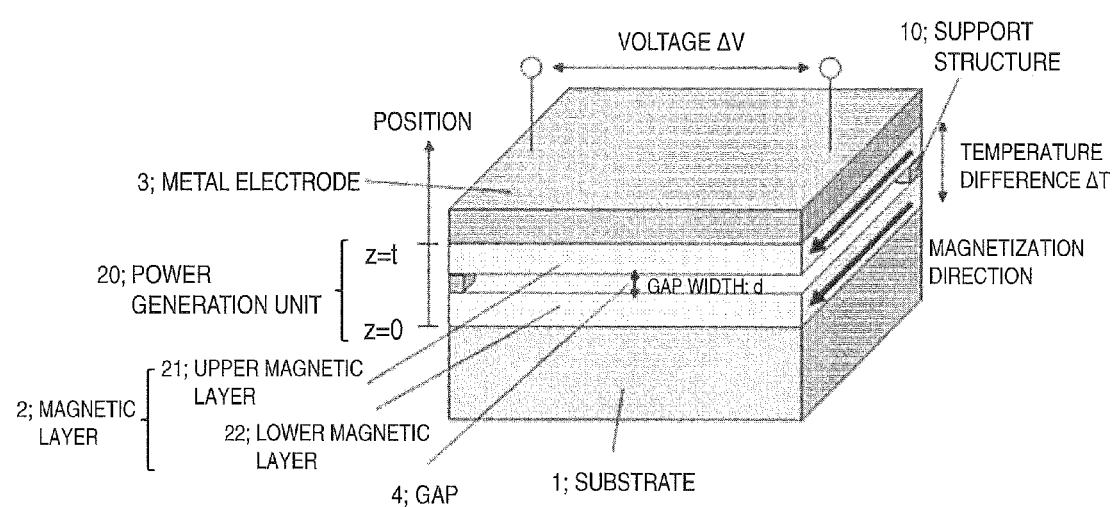
FIG. 1 is a diagram of one example of an arrangement of a first exemplary embodiment of the present disclosure.

In preferred modes of the present disclosure, a thermoelectric conversion device comprises: a first magnetic layer and a second magnetic layer (21 and 22) spaced to each other by a predetermined gap (d); and a first electrode (3) including a material having a spin orbit interaction, the first electrode disposed in contact with at least one of the first and the second magnetic layers (21 and 22). The first and the second magnetic layers (21 and 22) each have a magnetization direction substantially perpendicular to an electromotive force induced in the first electrode (3). The electromotive force (ΔV) according to a temperature difference (ΔT) between the first magnetic layer (21) and the second magnetic layer (22) in a surface-normal direction of the first and the second magnetic layers is extracted from the first electrode (3).

In preferred modes, a thermoelectric conversion device comprises: a two-layers of magnetic layers on a substrate (1), the magnetic layers including a first magnetic layer and a second magnetic layer (upper magnetic layer 21 and lower magnetic layer 22) having in-plane magnetization substantially perpendicular to an electromotive force direction; and a first electrode (3) on a side of the first magnetic layer opposite to a side thereof facing to the second magnetic layer.

A gap (4), or a dielectric layer (5) with a low thermal conductivity is arranged between the first and the second magnetic layers (21 and 22). A gap between the magnetic layers (21 and 22), that is to say, a thickness of the gap (4) or a thickness of the dielectric layer (5) is almost the same as a distance that a dipole interaction can reach.

In preferred modes, the film thicknesses of the first and the second magnetic layers (21 and 22) are respectively almost the same as characteristic lengths determined by diffusion of magnetic excitation, or the like. A presence of a gap (4) or a dielectric layer (5) with a low thermal conductivity between the first and the second magnetic layers (21 and 22) makes a thermal conduction by phonon in a direction of a thermal gradient is suppressed, and a thermal conductivity κ of the device is reduced. Since a spin flow carried by magnons propagates via the gap (4) by a magnetic dipole interaction, a thermoelectric power S does not so change. As the result, a performance index S/κ with a large value is obtained.

It is noted the above-mentioned characteristic length normally corresponds to a length scale to which a magnetic excitation (magnon) is able to diffuse. However, in the case wherein there is another energy relaxation factor, or the like, there may be a case in which a characteristic length cannot be determined by the diffusion length of magnetic excitation. More generally, it can be said in other words that a characteristic length tc is "a thickness of a magnetic layer on a per layer basis, in which a thermal electromotive force is saturated under a condition with a temperature difference applied between both surfaces of the device being constant. That is, even when a thickness t of the magnetic layer per layer is set to be the characteristic length tc or more, a drastic further improvement of a thermal electromotive force cannot be expected.

In preferred modes, the first and the second magnetic layers (21 and 22) each include a ferromagnetic material having a coercive force with respect to a magnetization characteristic substantially perpendicular to a direction of an electromotive force generated in the first electrode (3). This allows the first and the second magnetic layers (21 and 22) to hold a spontaneous magnetization (magnetization generated in a magnetic material in a situation in which the magnetic material is not subjected to an external magnetization), even under a zero magnetic field, thereby making it possible to perform a thermoelectric power generating operation without applying an external magnetization.

In preferred modes, a thermoelectric conversion device comprises a plurality of support bodies (support structures 10, support spherical bodies 31) arranged in contact with both of the first and the second magnetic layers (21 and 22) in the gap (4) between the first and the second magnetic layers (21 and 22). In one of preferred modes, the support includes a magnetic material having a magnetization.

In preferred modes, the support has a substantially columnar shape, or a shape in which at least one of end portions in contact with one of the first and the second layers is narrowed so as to have a cross section smaller than that at a central portion, for instance, at least one of shapes: a polyhedron including an acute-angled portion, a sphere, and a spheroid (or a shape similar to one of those).

In one of preferred modes, a side surface of the gap between the first and the second magnetic layers (21 and 22) may be sealed. The gap (4) may well be vacuum-sealed.

In preferred modes, a dielectric layer (5) may be provided between the first and the second magnetic layers (21 and 22).

In preferred modes, the first and the second magnetic layers (21 and 22) each may be constituted by a magnetic insulator.

In preferred modes, the first and the second magnetic layers (21 and 22) may be constituted by magnetic layers (ferromagnetic films) each having a coercive force with respect to a magnetization characteristic substantially perpendicular to a direction of an electromotive force generated in the first electrode.

The predetermined gap (gap width d) may preferably be less than or equal to a maximum propagation distance exerted by a magnetic dipole interaction of magnons between the first and the second magnetic layers (21 and 22). Preferably, the predetermined gap (gap width d) may be larger than or equal to 10 μm, and smaller than or equal to 100 μm.

In another preferred modes, a thermoelectric conversion device may comprise: the first electrode (3) disposed on a surface of the first magnetic layer (21) opposite to a surface of the first magnetic layer (21) facing to the second magnetic layer (22); and a second electrode (13) that includes a material shaving a spin orbit interaction and that is disposed on a surface of the second magnetic layer (22) facing to the first magnetic layer (21), wherein the second electrode (13) and the first magnetic layer are spaced to each other by the predetermined distance (d). A support (10) may be provided between the second electrode (13) and the first magnetic layer (21). Alternatively, a dielectric layer may be provided.

Alternatively, in another preferred modes, a thermoelectric conversion device may comprise: the first electrode (3); the second electrode (13); and a third electrode (14) that includes a material having a spin orbit interaction and that is disposed on a surface of the first magnetic layer (21) facing to the second magnetic layer (22), wherein the second and the third electrodes (13 and 14) may be spaced to each other by the predetermined distance (d). A support(s) (33) may be provided between the second and the third electrodes (13 and 14). Alternatively, a dielectric layer may be provided.

Alternatively, in yet another preferred modes, a thermoelectric conversion device may comprise: a substrate (1); a first magnetic layer (2) disposed on the substrate; a first conductive member (3) disposed on the first magnetic layer; and one or more laminated bodies, each including a conductive member (2), a magnetic layer (2), and a conductive member (3). The first conductive member (3) and the laminated body, or the plural laminated bodies are spaced to each other by a predetermined gap. The magnetic layer has a magnetization direction substantially perpendicular to a direction of an in-plane electromotive force. The electromotive force is extracted from the conductive member of the upper-most layer due to a temperature difference between the first magnetic layer on the substrate and the magnetic layer of the laminated body in the surface-normal direction of the magnetic layer.

Exemplary embodiments will now be described in detail with reference to drawings below.

First Exemplary Embodiment

Referring to FIG. 1, an overall structure of a thermoelectric conversion device in accordance with the first exemplary embodiment is schematically illustrated in a perspective view. A magnetic layer 2 including an upper magnetic layer 21 and a lower magnetic layer 22 is formed on a substrate 1. A gap 4 (gap width d) is provided between the upper magnetic layer 21 and the lower magnetic layer 22. A metal electrode 3 is provided on the upper magnetic layer 21. It is assumed that both the upper and lower magnetic layers 21 and 22 each have a magnetization direction along one direction (direction substantially perpendicular to that of an electromotive force) in parallel with a film surface.

Figure 2:
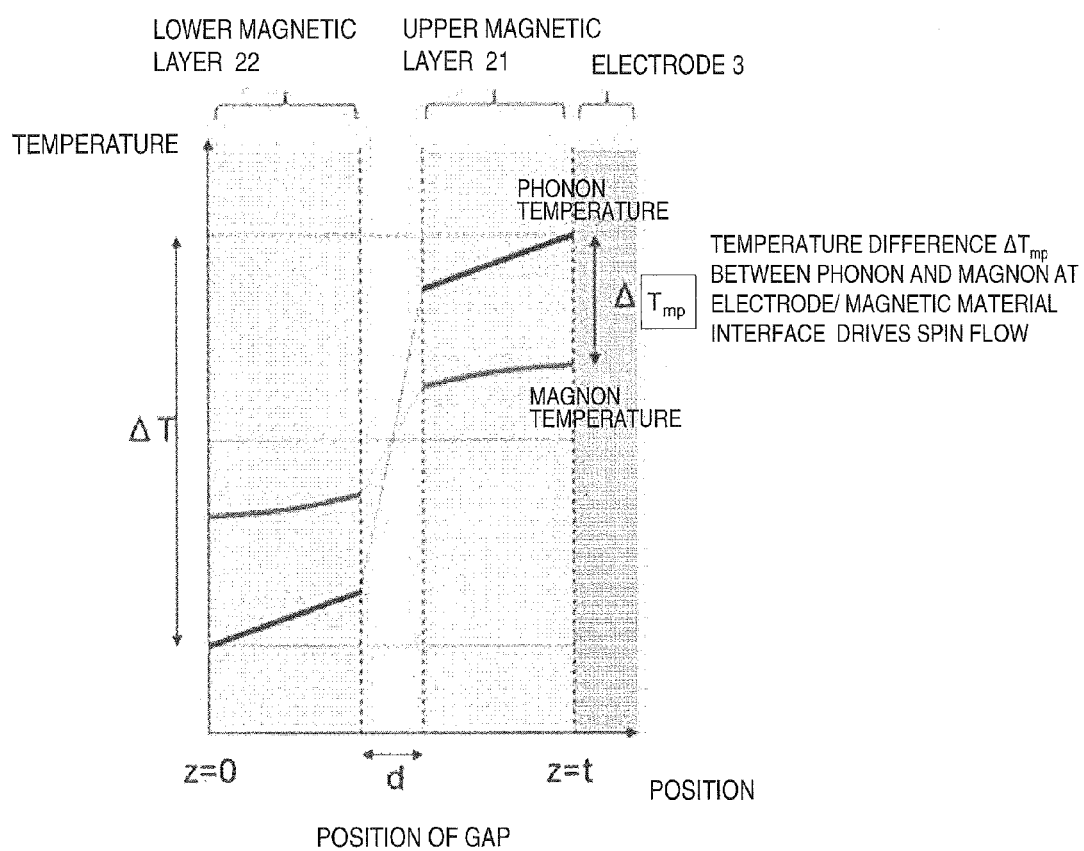
FIG. 2 is a diagram for explaining positional dependency of temperature difference of lattice-magnon in the first exemplary embodiment of the present disclosure.

In the present embodiment, the gap 4 is preferably supported by support structures 10 or the like that are dispersed here and there on the surface. Thermal conduction by phonons between the upper magnetic layer 21 and the lower magnetic layer 22 is suppressed by an adiabatic effect of the gap 4. On the other hand, magnons can propagate through the interlayer (between the upper magnetic layer 21 and the lower magnetic layer 22) by a magnetic dipole interaction over the gap 4. Thus, when a temperature gradient is applied to the gap between the upper magnetic layer 21 and the lower magnetic layer 22 in a surface-normal direction thereof, there is generated a large temperature difference between lattice temperatures (a phonon temperature of the lower magnetic layer 22 and a phonon temperature of the upper magnetic layer 21) separated by the gap 4 (gap width d), as shown in FIG. 2.

On the other hand, as for a magnon temperature, only a small temperature difference is negated in the gap between the lower magnetic layer 22 and the upper magnetic layer 21.

Figure 20:
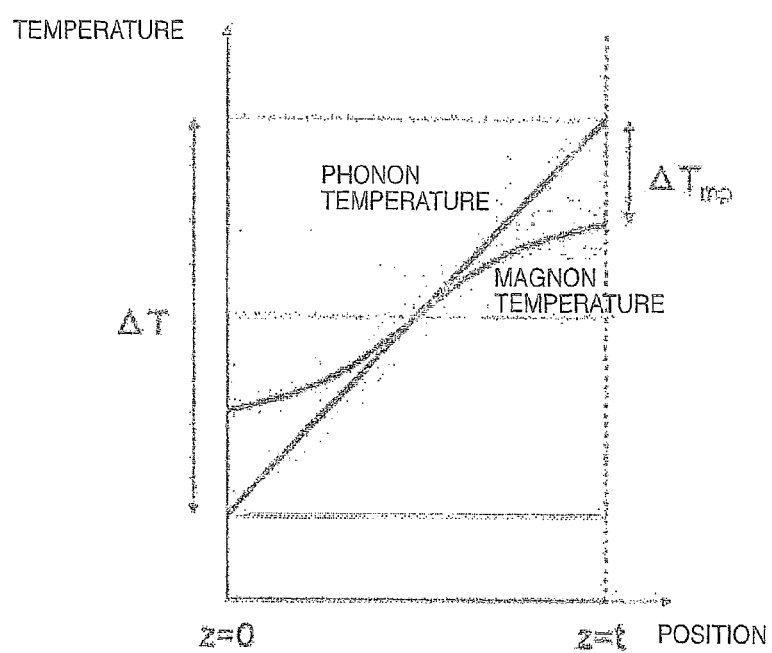
FIG. 20 is a diagram for explaining positional dependency of temperature difference of lattice-magnon of the related art.

As the result, a larger phonon-magnon temperature difference $\Delta T_{mp}$ can be obtained at a interface (z=t in FIG. 2) between the upper magnetic layer 21 and the metal electrode 3 than that in the related art illustrated in FIG. 20.

Figure 19:
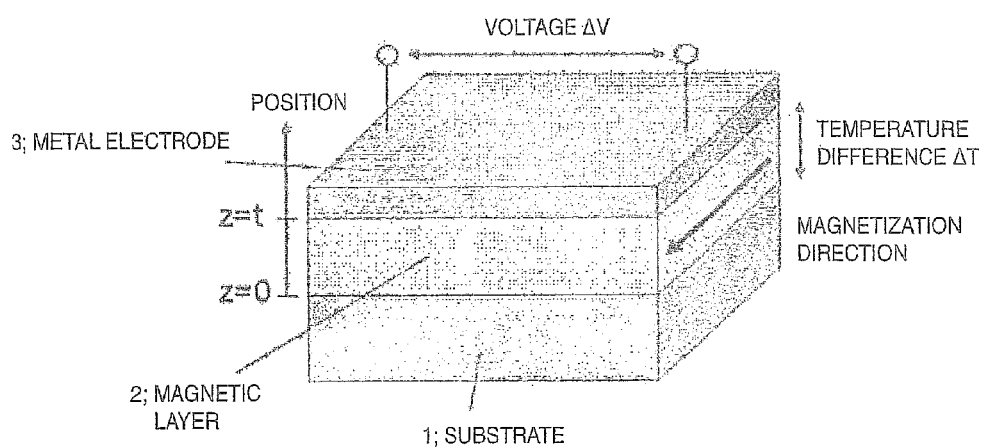
FIG. 19 is a perspective diagram of an embodiment of a spin thermoelectric conversion device of a related art.

A spin injection from the upper magnetic layer 21 to the metal electrode 3 is driven by lattice–magnon temperature difference $\Delta T_{mp}$, and a larger thermal electromotive force $\Delta V$ can be obtained at both terminals of the metal electrode 3 by an inverse spin Hall effect in the metal electrode 3 than that of the related art illustrated in FIG. 19.

As described above, a thermoelectric performance index is proportional to the ratio S/κ of the thermoelectric power and the thermal conductivity. An effectively small thermal conductivity κ can be obtained by an adiabatic effect of the gap 4. A spin Seebeck effect owing to the presence of the gap 4, and a suppression of the thermoelectric power S owing to the spin Seebeck effect are relatively small. Thus, S/κ is increased as a whole, so that an increase in the thermoelectric performance index occurs.

In the present embodiment, the smaller the thermal conductivity κ of the magnetic layer 2 (21 and 22) is, the more efficiently the thermoelectric effect is exerted. Therefore, the upper and the lower magnetic layers 21 and 22 preferably are made of a magnetic insulator. For instance, an oxide magnetic material such as a garnet ferrite, a spinel ferrite and so forth can be used. Alternatively, a metal magnetic material may be used as the magnetic layer 2, so long as adiabaticy in the gap portion 4 is assured.

In the case where a magnetic material having a coercive force is used as the magnetic layer 2, a thermoelectric conversion device, which becomes operational even under a zero magnetic field, can be obtained by initializing a magnetization direction of the magnetic layer 2 once by an external magnetic field or the like.

In the present embodiment, the metal electrode 3 includes a material having a spin orbit interaction in order to extract a thermal electromotive force using the inverse spin Hall effect. For example, a metal material having a relatively large spin orbit interaction, such as Au, Pt, and Pd, or an alloy material including these elements are used. It is noted that in order to enhance the inverse spin Hall effect, impurities, such as Fe and Cu may be added to the metal electrode 3. In the present embodiment, the metal electrode 3 is film-formed by a sputtering, a vapor deposition, a plating method, a screen printing or the like. Here, a thickness of the metal electrode 3 may preferably be set to be larger than or equal to at least a spin diffusion length of the metal material. For instance, when the metal electrode 3 is Au, the thickness is preferably larger than or equal to 50 nm; when the metal electrode 3 is Pt, the thickness is preferably larger than or equal to 10 nm.

In the present embodiment, it suffices that the substrate 1 can support the magnetic layer 2 and the metal electrode 3.

For instance, a material, such as Si, glass, alumina, sapphire, gadolinium gallium garnet (GGG), and polyimide can be used as the substrate 1 (though not limited thereto).

A plate shaped substrate is not necessarily used for the substrate 1, but a structure with a curvature, a concave and convex, an architectural product, or the like may be directly used as the substrate 1.

It is noted that in the present embodiment, in the case where there is a structure or a situation in which the magnetic layer 2 is directly fixed to a thermal source, the substrate 1 is not always necessary, and the thermal source itself can be used as a substrate supporting the thermoelectric conversion device.

In order not to degrade a thermal insulating performance obtained by the gap 4, the support structure 10 preferably has a small value of a thermal conductance (thermal conducting easiness; thermal conductance C is given as C=λ/l: where λ is a thermal conductivity, and l is a thickness of the material) by using a fine structure, or the support structure 10 preferably is formed by a material with a low thermal conductivity, such as a glass and an organic material.

By reasons below, the gap width d of gap 4 is one of the most important factors in designing a device.

(1) When the gap width d of gap 4 is too large, a magnetic dipole interaction over the gap 4 becomes small rapidly, so that propagation of magnons through interlayers (propagation between the lower magnetic layer 22 and the upper magnetic layer 21) is suppressed. Thus, a large spin Seebeck effect (a lager value of lattice–magnon temperature difference $\Delta T_{mp}$) cannot be obtained.

On the other hand, in fact, air also has a finite thermal conductivity (~0.03 W/(mK)).

Thus, (2) When the gap width d of gap 4 is too small, a sufficient adiabatic effect cannot be obtained in the gap 4, so that a thermoelectric performance is deteriorated.

In order to meet the above requirements, it is necessary to design a proper gap. First, as for the above (1), the gap width d is designed to be smaller or equal to 100 μm. Non-Patent Literature 3 (Europhysics, Letters 90, 27003 (2010)) in which a magnetic dipole interaction under separation by a gap is investigated, reports that a magnon propagation efficiency through a magnetic dipole interaction is not reduced so much in the case of a gap width of 100 μm or less. Therefore, with a length scale in which magnons can propagate through the gap by a magnetic dipole interaction being defined as a "maximum propagation distance", it is conceived that the maximum propagation distance is about 100 μm.

According to requirement of the above (1), it is preferred that the gap width d is less than or equal to the maximum propagation distance, that is, less than or equal to 100 μm.

Further, taking the above (2) into account, it is preferred that the gap width d is larger than or equal to 10 μm.

In FIG. 1, an air layer of the gap 4 is set to be larger than or equal to 10 μm, a thermal conductance per unit area becomes less than or equal to 3 kW/K, so that practically, a sufficient adiabatic effect can be expected.

From the above consideration, the gap width d of gap 4 is preferably 100 μm or less, and particularly, the gap width d is prefer in a range from 10 μm to 100 μm.

It is noted that in order to obtain a greater adiabatic effect by preventing a thermal conduction through an air at the portion of gap 4, the gap 4 may be vacuum-sealed. When a vacuum degree in the portion of the gap 4 is smaller than atmospheric pressure, this effect can be expected. Particularly, the gap 4 vacuum-sealed to 100 Pa or less enables highly efficient heat insulation, as a result of which it can be expected to implement a higher performance thermoelectric device.

In the thermoelectric conversion device of the above-mentioned embodiment, when a temperature gradient in a surface-normal direction is applied, an angular momentum flow (spin flow) is induced along the direction of the temperature gradient due to a spin Seebeck effect in the magnetic layer 2, the spin flow flowing into a metal electrode 3 adjacent thereto. More specifically, due to a lattice–magnon temperature difference $\Delta T_{mp}$ occurring at an interface between the upper magnetic layer 21 and the metal electrode 3, there occurs a spin injection from the upper magnetic layer 21 to the metal electrode 3. The spin flow flowing into the metal electrode 3 is converted into a current (electromotive force) along a direction perpendicular to the magnetization direction of the magnetic layer 2 due to an inverse spin Hall effect in the metal electrode 3.

In other words, in a power generation unit 20 configured by the magnetic layer 2 and the metal electrode 3, a thermal electromotive force is generated by a temperature difference applied.

Example 1

Figure 3:
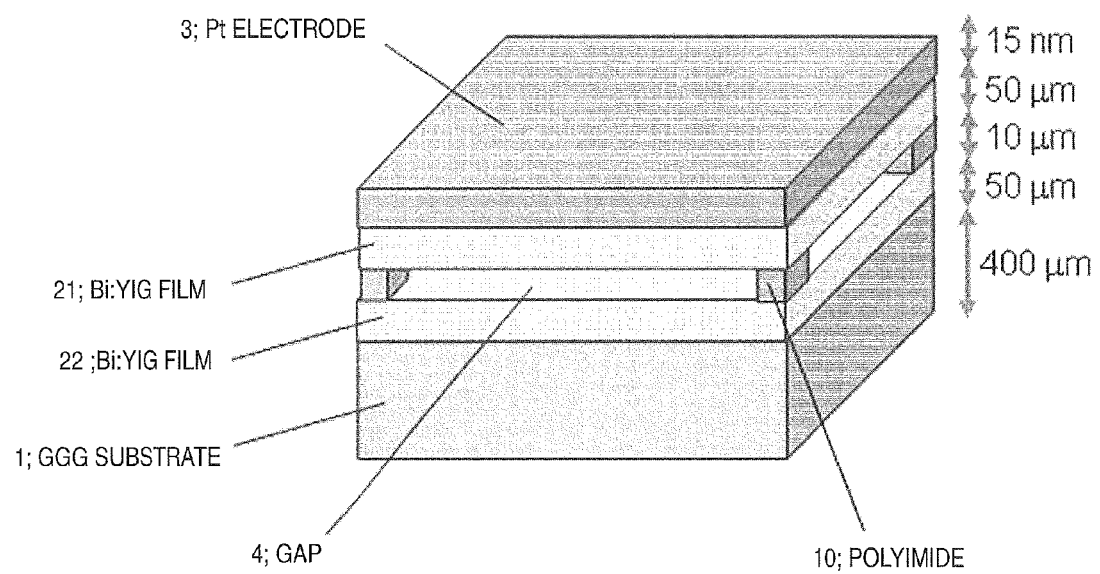
FIG. 3 is a diagram of one specific example (Example 1) of the first exemplary embodiment.

FIG. 3 is a diagram (perspective diagram) illustrating a configuration of one specific example (Example 1) of the first exemplary embodiment which has been described with reference to FIG. 1.

In FIG. 3, a gadolinium gallium garnet (GGG) substrate with a thickness of 400 μm is used as the substrate 1.

Bi-doped YIG (Bi:YIG, composition $BiY_2Fe_5O_{12}$ (bismuth substituted yttrium iron garnet)) thin films are used as the lower magnetic layer 22 and the upper magnetic layer 21.

As the metal electrode 3, Pt with a film thickness of 15 nm is used.

As the support structure 10, a polyimide with a thickness of 10 μm is used.

Figure 4:
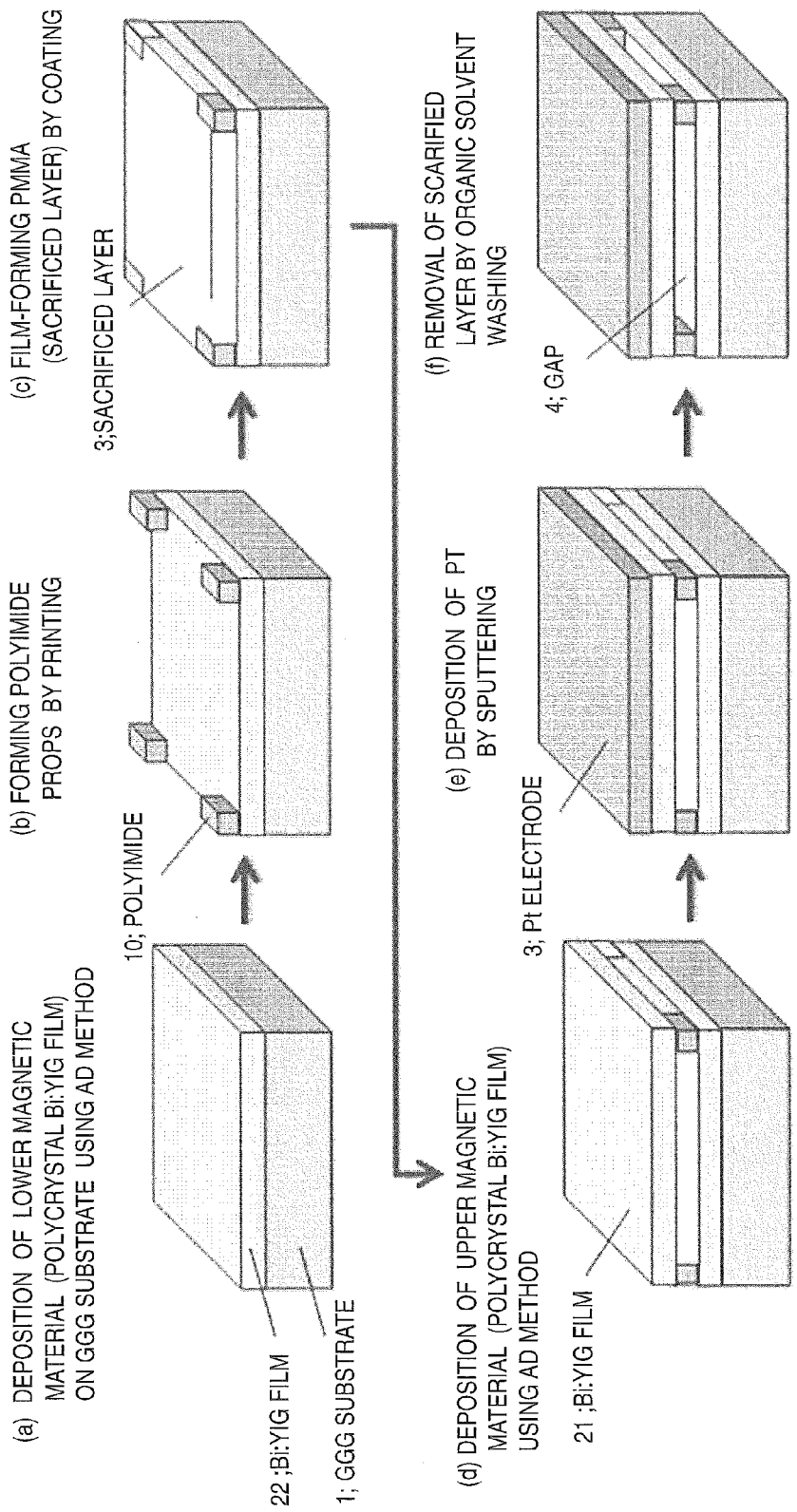
FIG. 4 is a diagram illustrating a fabrication method of Example 1.

FIG. 4 is a diagram explaining a method for fabricating a thermoelectric conversion device in accordance with Example 1 in FIG. 3. The following describes representative steps (1) to (6).

(1) <(a) in FIG. 4>

A Bi:YIG film 22 is deposited on a GGG substrate 1 using an aerosol deposition method (AD method). Bi:YIG minute particles with a diameter of 300 nm are used as a Bi:YIG raw material. The Bi:YIG minute particles are charged in a container of an aerosol generator (not shown), and the GGG substrate 1 is fixed to a holder in a deposition chamber (not shown). In this situation, by causing a pressure difference between the deposition chamber and the aerosol generator container to be generated, the Bi:YIG minute particles are drawn into the deposition chamber to be sprayed via a nozzle on the GGG substrate 1. Minute particles are subjected to pulverization and recombination by a collision energy at the time of being sprayed on the substrate 1 to have a YIG polycrystaline material formed on the substrate 1. A uniform Bi:YIG film 22 is deposited with a film thickness of 50 μm on the substrate 1 by scanning a substrate stage two-dimensionally.

(2) <(b) in FIG. 4>

After that, a polyimide 10 that serves as a support structure (props) is deposited with a width of about 30 μm and a thickness of about 10 μm on the Bi:YIG film 22 by an inkjet printing method. To arrange a gap stably, the polyimides 10 are arranged at intervals of 0.3 mm in a matrix form.

(3) <(c) in FIG. 4>
Further, PMMA (polymethyl methacrylate) is deposited by coating and drying the PMMA among the polyimides (props) 10. The PMMA serves as a sacrifice layer for generating a gap.
(4) <(d) in FIG. 4>
Bi:YIG film 21 with a thickness of 50 μm served as an upper magnetic material is film-formed on the polyimides 10 and the PMMA by the AD method again.
(5) <(e) in FIG. 4>
After that, a Pt electrode 3 is deposited by sputtering (film thickness: 15 nm).
(6) <(f) in FIG. 4>
Lastly, PMMA as a sacrificed layer is removed by performing a ultrasonic cleaning using an organic solvent such as acetone, as a result of which the gap 4 is formed.

With the above described manufacturing processes, a thermoelectric conversion device with the gap 4 is configured.

Second Exemplary Embodiment

Figure 5:
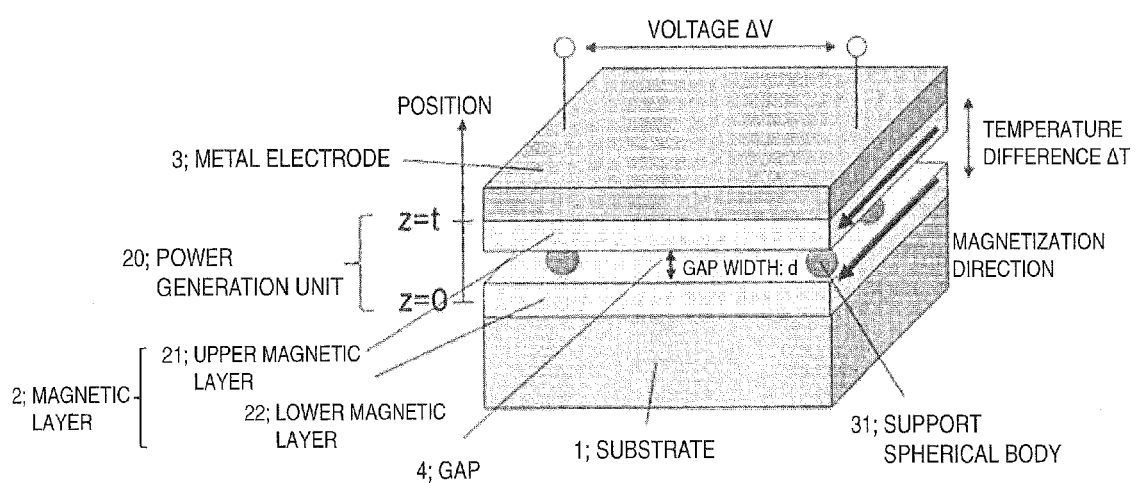
FIG. 5 is a diagram illustrating one example of an arrangement of a second exemplary embodiment of the present disclosure.

FIG. 5 is a diagram (perspective view) illustrating one example of an arrangement of a thermoelectric conversion device in accordance with a second exemplary embodiment of the present disclosure. A difference of the present embodiment from the first exemplary embodiment illustrated in FIG. 1 resides in that support structure 10 in FIG. 1 is replaced by a support spherical body 31. As illustrated in FIG. 5, the gap 4 is formed by inserting the support spherical bodies 31 between the upper magnetic layer 21 and the lower magnetic layer 22.

In the case where the support spherical body 31 having such a spherical shape is inserted into the gap 4, areas at which the support spherical body 31 is contacted with the upper magnetic layer 21/the lower magnetic layer 22 become small. Thus, it is possible to suppress phonon conduction (thermal leakage) through the support spherical body 31 to achieve a high thermoelectric performance.

It is noted that so long as the support spherical body 31 meets the above object, the support spherical body 31 may be a non-perfect spherical body. For instance, in order to improve stability, a spheroid may be used. Alternatively, a polyhedron including acute-angled portions and so forth (e.g., contact with the upper magnetic layer 21 and/or the lower magnetic layer 22 at apexes of the acute-angled portions) in place of a curved surface may be used.

Example 2

Figure 6:
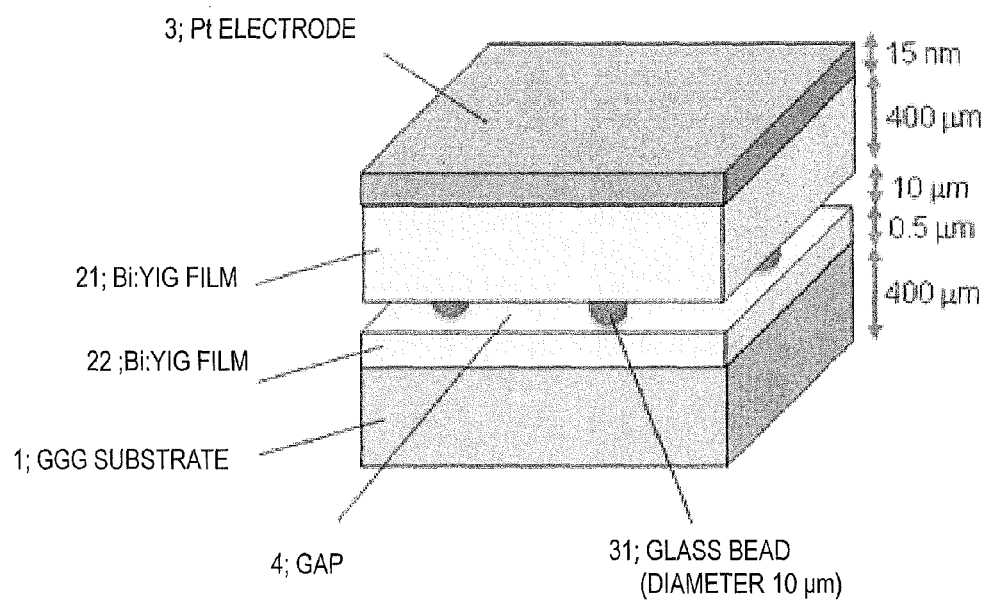
FIG. 6 is a diagram illustrating one specific example (Example 2) of the second exemplary embodiment.

FIG. 6 is a diagram (perspective diagram) illustrating one example (Example 2) of a second exemplary embodiment of the present disclosure. In FIG. 6, a gadolinium gallium garnet (GGG) substrate with a thickness of 400 μm is used for the substrate 1, and a Bi-doped YIG (Bi:YIG, composition $BiY_2Fe_5O_{12}$) thin film with a thickness of 0.5 μm which is film-formed by coating is used as the lower magnetic layer 22. A polycrystalline Bi-doped YIG (Bi:YIG, a composition thereof being $BiY_2Fe_5O_{12}$) plate with a thickness of 400 μm which has been sintered is used for the upper magnetic layer 21. Pt with a film thickness of 15 nm is used as the metal electrode 3. Glass beads with a diameter 10 μm are used as the respective spherical bodies 31.

Figure 7:
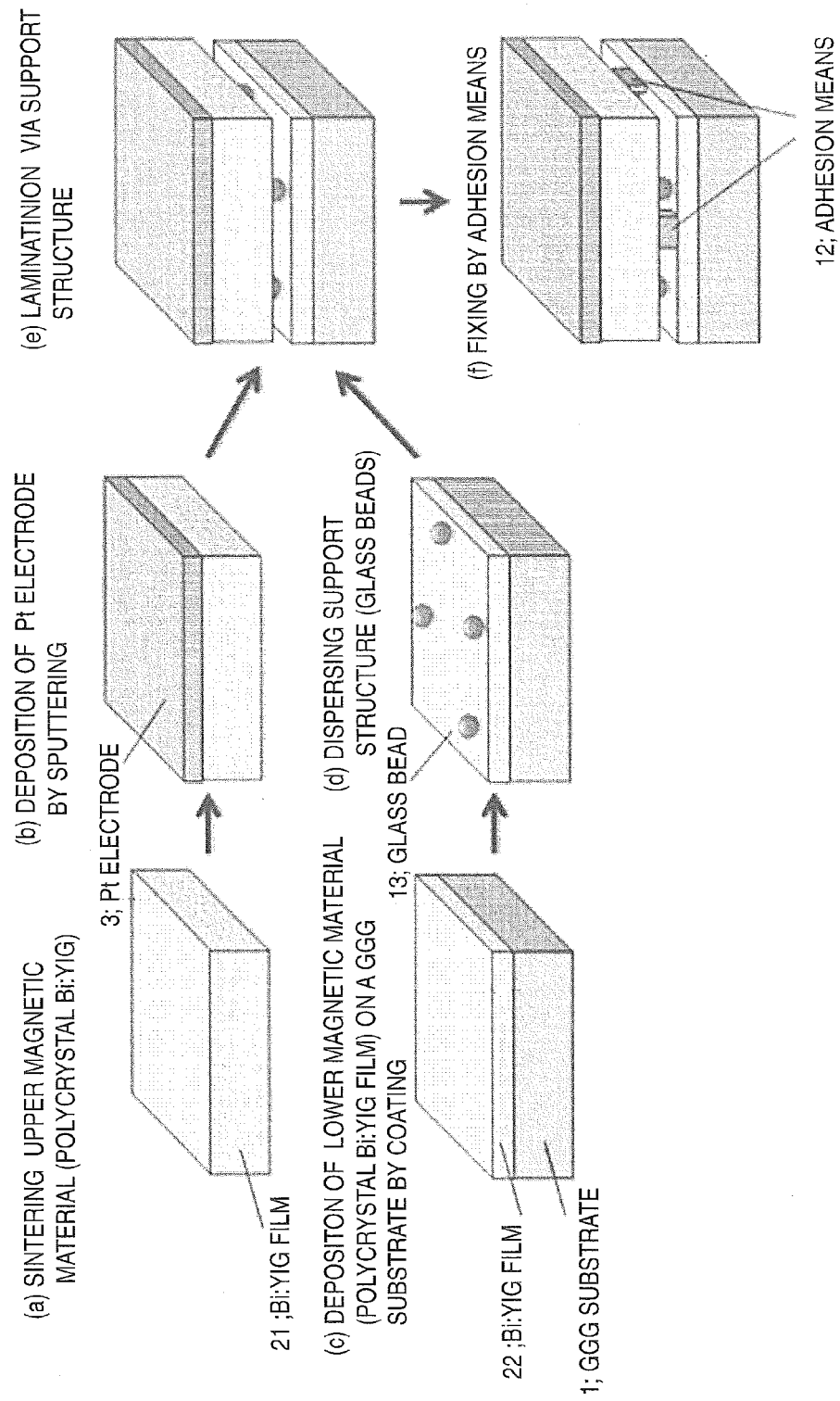
FIG. 7 is a diagram illustrating a fabrication method of Example 2.

FIG. 7 is a diagram explaining a fabrication method in accordance with Example 2. Representative processes (1) to (6) will now be described below.
(1) <(a) in FIG. 7>
First, a sintered polycrystalline B:YIG plate 21 is provided.

(2) <(b) in FIG. 7>
A Pt electrode 3 is deposited on the polycrystal Bi:YIG plate 21 by sputtering.
(3) <(c) in FIG. 7>
Apart from the above (1) and (2) steps, a Bi:YIG film 22 is deposited on the GGG1 substrate by a metal organic decomposition method (MOD method). As for a solvent, a MOD solvent manufactured by KOJUNDO CHEMICAL LABORATORY Co., LTD. is used. In the above solvent, a metal raw material with an appropriate mol ratio (Bi:Y:Fe=1:2:5) is being dissolved with a concentration of 5% in acetate ester. This solvent is coated on the GGG substrate 1 by spin coat (the number of revolutions 500 rpm, revolution for 30 s), and dried on a hot plate at 150 degrees C. for 5 minutes; and after that, the GGG substrate 1 is sintered in an electric furnace at 720 degrees C. for 14 hours. As a result, a Bi:YIG film 22 with a film thickness of 0.5 μm is formed in the GGG substrate 1.
(4) <(d) in FIG. 7>
After that, glass beads 31 are dispersed with a density of about $1000/cm^2$ on the Bi:YIG film 22.
(5) <(e) in FIG. 7>
The Pt electrode 3/Bi:YIG plate 21 which has been made in advance in the step (2) is laminated on the Bi:YIG film 22 on which glass beads 31 have been dispersed in the step (4), via the glass beads 31 (support spherical bodies 31 in FIG. 5).
(6) <(f) in FIG. 7>
Furthermore, the Bi:YIG film 22 and the Bi:YIG plate 21 which are laminated via glass beads 10 (support structure) are fixed by injecting adhesion means 12 or the like, such as an adhesive agent from side surfaces to form an thermoelectric conversion device.

Here, a main object of the adhesion means 12 is to fix the Bi:YIG plate (upper magnetic layer) 21 and the Bi:YIG film (lower magnetic layer) 22. Besides, according to purposes, in order to further improve the heat insulation effect, vacuum-sealing may be performed by sealing the side surfaces. As described above, the gap 4 with a thickness of 10 μm is formed in the thermoelectric conversion device by inserting the glass beads 31.

In the case where a spherical object like a glass bead is used for the support, areas at which the support structure is contacted with and the upper magnetic layer 21/the lower magnetic layer 22 become small. This makes it possible to suppress phonon conduction (thermal leakage) through the support structure.

Third Exemplary Embodiment

Figure 8:
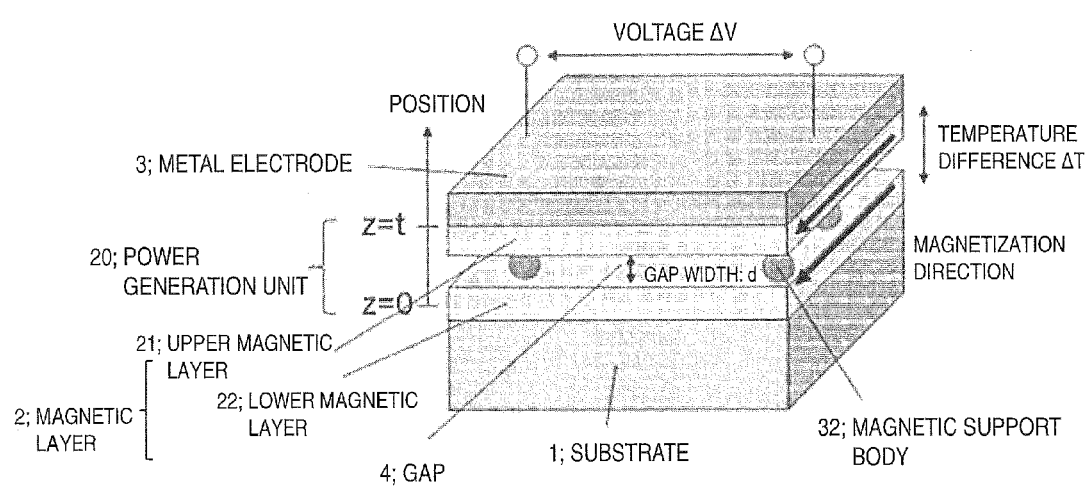
FIG. 8 is a diagram illustrating one example of an arrangement of a third exemplary embodiment of the present disclosure.

FIG. 8 is a diagram (perspective diagram) illustrating an arrangement of a thermoelectric conversion device in accordance with a third exemplary embodiment of the present disclosure. A difference of the present embodiment from the first exemplary embodiment illustrated in FIG. 1 resides in that the support structure 10 in FIG. 1 is replaced with magnetic support bodies 32. The magnetic support body 32 includes material having magnetization such as ferromagnetic substance and ferrimagnetic substance.

In the case where magnetic substance is used for the support as described above, magnon can propagate via the support, so that high thermoelectric conversion performance is expected.

Furthermore, In the case where the magnetic support bodies 32 are formed in spherical form, contact area between the magnetic support bodies 32 and the upper magnetic layer 21/the lower magnetic layer 22 becomes small, which makes it possible to reduce the phonon conduction (thermal conduction by phonon, thermal leakage) via the magnetic support bodies 32, so that high thermoelectric performance is obtained.

Example 3

Figure 9:
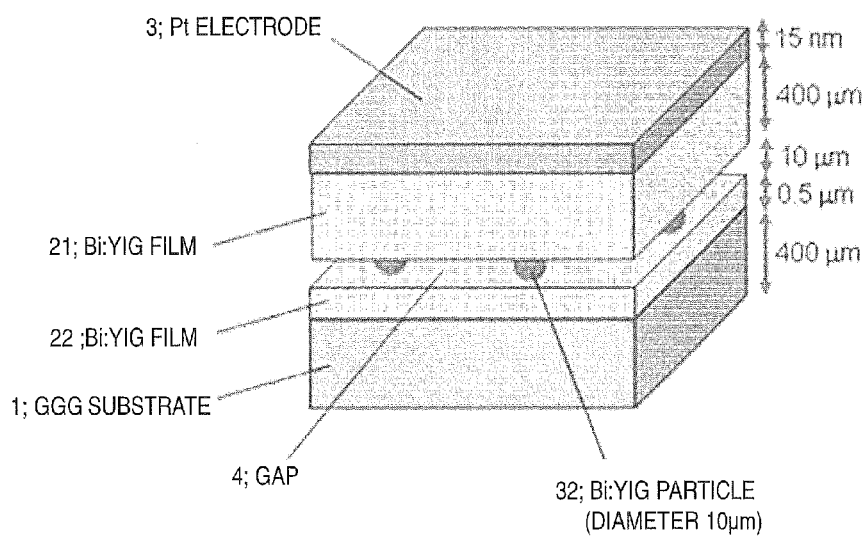
FIG. 9 is a diagram illustrating one specific example (Example 3) of the third exemplary embodiment.

FIG. 9 is a diagram (perspective diagram) illustrating an arrangement in accordance with a specific example (Example 3) of a third exemplary embodiment of the present disclosure.

In FIG. 9, a gadolinium gallium garnet (GGG) substrate with a thickness of 400 μm is used as the substrate 1;

a Bi-doped YIG (Bi:YIG, a composition thereof being $BiY_2Fe_5O_{12}$) thin film with a thickness of 0.5 μm which is deposited by coating is used as the lower magnetic layer 22;

a polycrystalline Bi-doped YIG (Bi:YIG, a composition thereof being $BiY_2Fe_5O_{12}$) plate with a thickness of 400 μm which has been sintered is used as the upper magnetic layer 21;

Pt with a film thickness of 15 nm is used as the metal electrode 3; and

A Bi:YIG particle with a diameter of 10 μm is used as the magnetic support body 32.

The thermoelectric conversion device in FIG. 9 can be designed/implemented using the fabrication method (laminating the upper magnetic layer 21 and the lower magnetic layer 22 via magnetic support bodies 32) in accordance with Example 2 described with reference to FIG. 7.

Fourth Exemplary Embodiment

Figure 10:
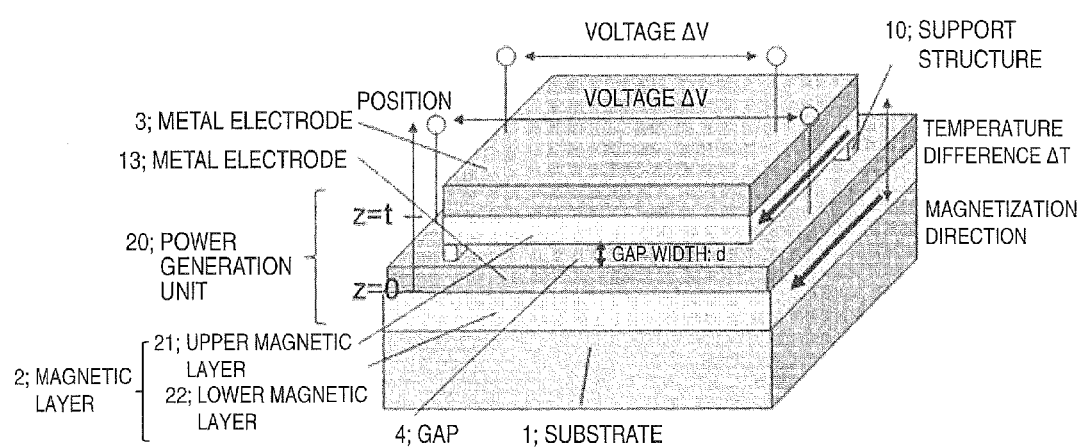
FIG. 10 is a diagram illustrating one example of an arrangement of a fourth exemplary embodiment of the present disclosure.

FIG. 10 is a diagram (perspective diagram) illustrating schematically one example of an arrangement of a thermoelectric conversion device in accordance with a fourth exemplary embodiment of the present disclosure. A difference of the present embodiment from the above-mentioned first exemplary embodiment illustrated in FIG. 1 resides in that an electrode 13 is newly added between the lower magnetic layer 22 and the gap 4.

Figure 11:
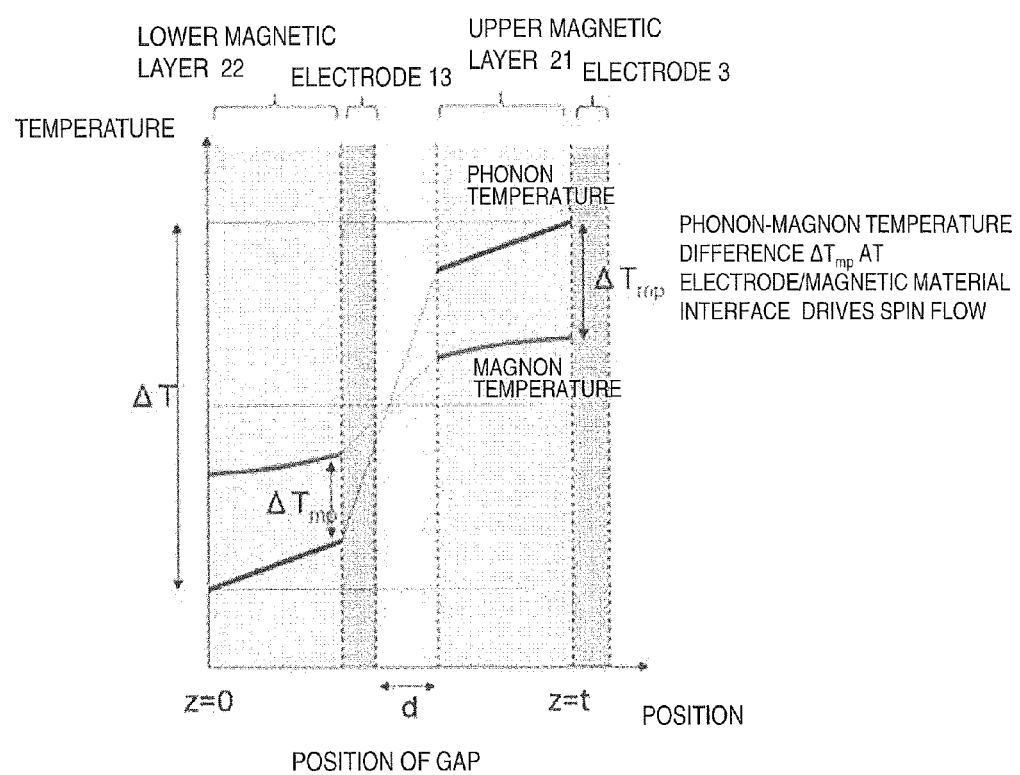
FIG. 11 is a diagram for explaining positional dependency of temperature difference of lattice-magnon of the fourth exemplary embodiment of the present disclosure.

As illustrated in FIG. 11, since a lattice–magnon temperature difference $\Delta T_{mp}$ also occurs at an interface between the electrode 13 and the lower magnetic layer 22, a thermal electromotive force can be also extracted from the electrode 13.

It is noted that since the electrode 13 is thin enough as compared with the lower magnetic layer 22, FIG. 11 is drawn by ignoring a change of a phonon temperature and magnon temperature in the electrode 13. With this arrangement, the thermoelectric conversion device can produce about twice electric power under a given temperature gradient. As the result, a more efficient thermoelectric power generation becomes possible.

Example 4

Figure 12:
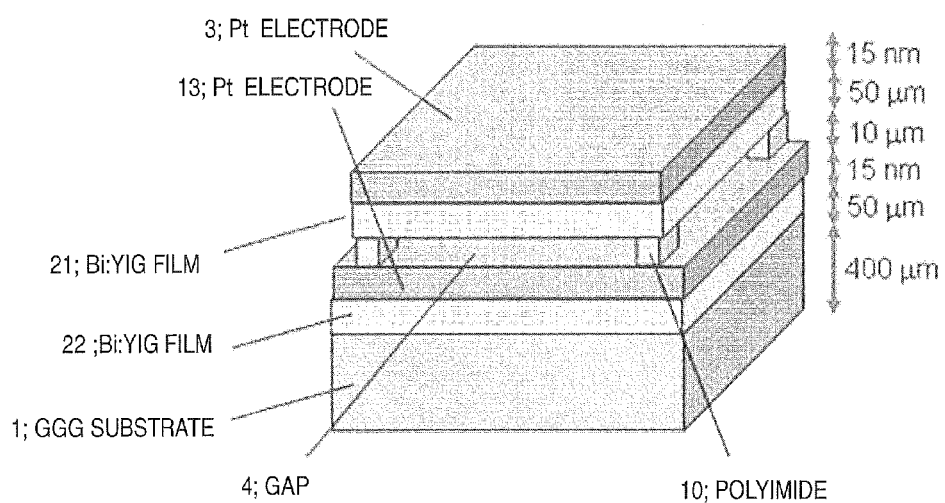
FIG. 12 is a diagram illustrating one specific example (Example 4) of the fourth exemplary embodiment.

FIG. 12 is a diagram (perspective view) illustrating a specific example (Example 4) of the fourth exemplary embodiment of the present disclosure.

In FIG. 12, a gadolinium gallium garnet (GGG) substrate with a thickness of 400 μm is used as the substrate 1;

Bi-doped YIG (Bi:YIG, composition $BiY_2Fe_5O_{12}$) thin films with a thickness of 50 μm are used as the lower magnetic layer 22 and the upper magnetic layer 21;

Pt with a film thickness of 15 nm is used as the metal electrode 3;

similarly, Pt with a film thickness of 15 nm is used as the metal electrode 13; and a polyimide with a thickness of 10 μm is used as the support structure 10. A mounting method similar as in the first exemplary embodiment is adopted.

Fifth Exemplary Embodiment

Figure 13:
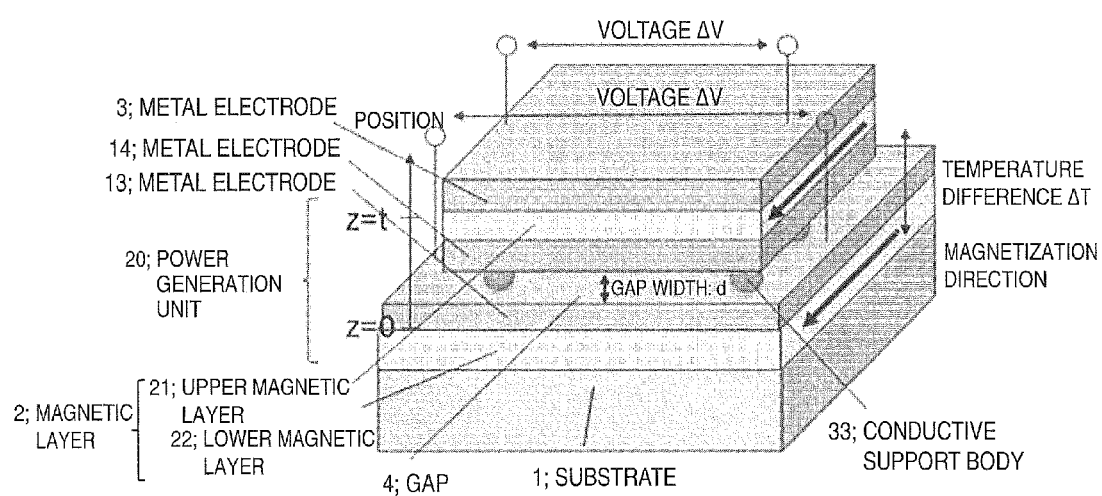
FIG. 13 is a diagram illustrating one example of an arrangement of a fifth exemplary embodiment of the present disclosure.

FIG. 13 is a diagram (perspective diagram) illustrating schematically one example of an arrangement of a fifth exemplary embodiment of the present disclosure. The present embodiment is a variant of the fourth exemplary embodiment illustrated in FIG. 12. A difference of the present embodiment from the fourth exemplary embodiment resides in that an electrode 14 is newly added between the gap 4 and the upper magnetic layer 21, and a conductive support body 33 is used in place of the support structure 10. A top surface of the electrode 14 is in contact with a bottom surface of the upper magnetic layer 21, and the conductive support bodies 33 are provided in the gap 4 between a bottom surface of the electrode 14 and a top surface of the electrode 13 on the lower magnetic layer 22.

Figure 14:
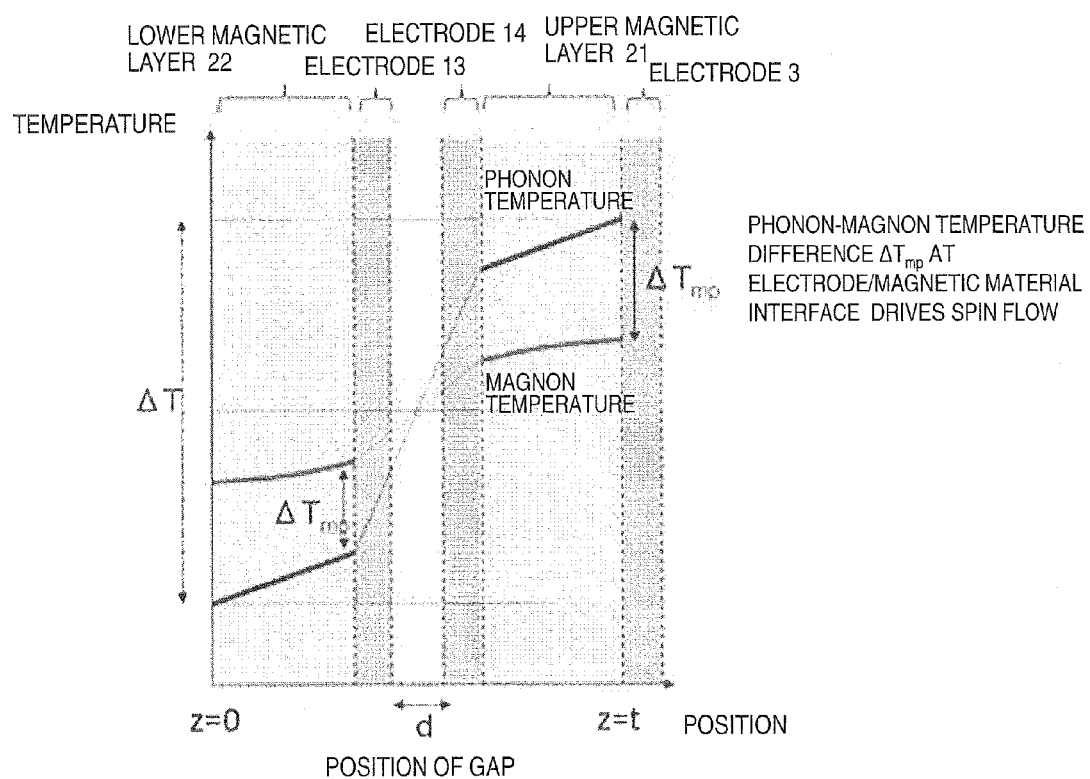
FIG. 14 is a diagram for explaining positional dependency of temperature difference of lattice-magnon of the fifth exemplary embodiment of the present disclosure.

As shown in FIG. 14, since a lattic-magnon temperature difference $\Delta T_{mp}$ occurs also at an interface between the electrode 14 and the upper magnetic layer 21, a thermal electromotive force can be also extracted from the electrode 14. It is noted that since the electrode 14 is thin enough as compared with the upper magnetic layer 21, FIG. 14 is drawn by ignoring a change of a phonon temperature and a magnon temperature in the electrode 14.

The conductive support body 33 with a high electric conductivity is used as a support structure between the electrode 13 and the electrode 14, which enables a thermal electromotive force induced at both of the electrode 13 and the electrode 14 to be extracted from common terminals, which enables the device structure to be simplified at the same time. It is noted that although in FIG. 13, spherical objects are illustrated as the conductive support bodies 33, the conductive support bodies 33 may be objects having an optional shape, such as a rectangular shape and a polyhedron.

Example 5

Figure 15:
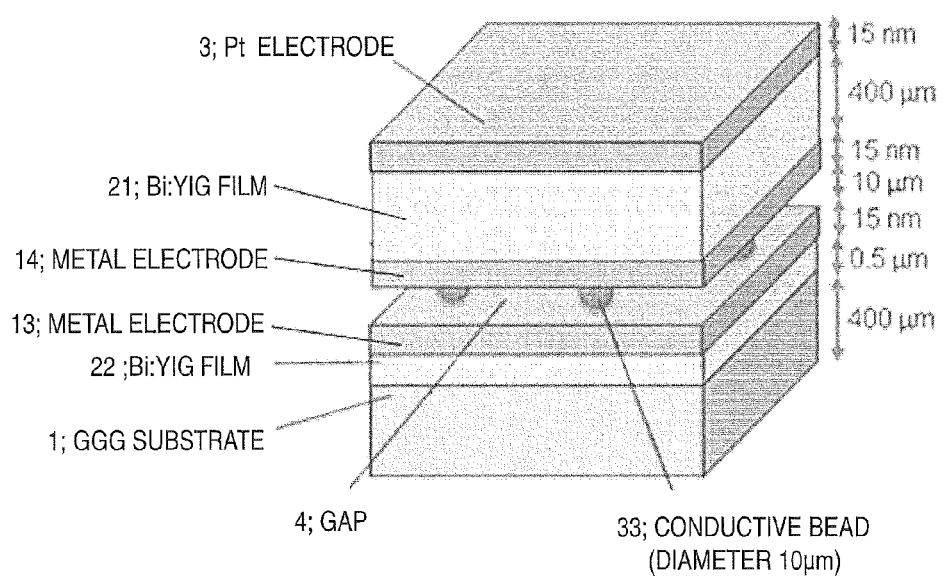
FIG. 15 is a diagram illustrating one specific example (Example 5) of the fifth exemplary embodiment.

FIG. 15 is a diagram (perspective diagram) illustrating a specific example of a fifth exemplary embodiment of the present disclosure. In FIG. 15, a gadolinium gallium garnet (GGG) substrate with a thickness of 400 μm is used as the substrate 1;

a Bi-doped YIG (Bi:YIG, composition $BiY_2Fe_5O_{12}$) thin film with a thickness of 0.5 μm which is deposited by coating is used as the lower magnetic layer 22;

a polycrystalline Bi-doped YIG (Bi:YIG, composition $BiY_2Fe_5O_{12}$) plate with a thickness of 400 μm which has been sintered is used as the upper magnetic layer 21;

Pt with a film thickness of 15 nm is used as the metal electrodes 3, 13 and 14; and glass beads with a diameter of 10 μm onto to which Ag is plated are used as the conductive support bodies 33. As for the implementation of the present example, the fabrication method (FIG. 7) as described in the above-mentioned Example 2 is used for design and implementation.

Sixth Exemplary Embodiment

Figure 16:
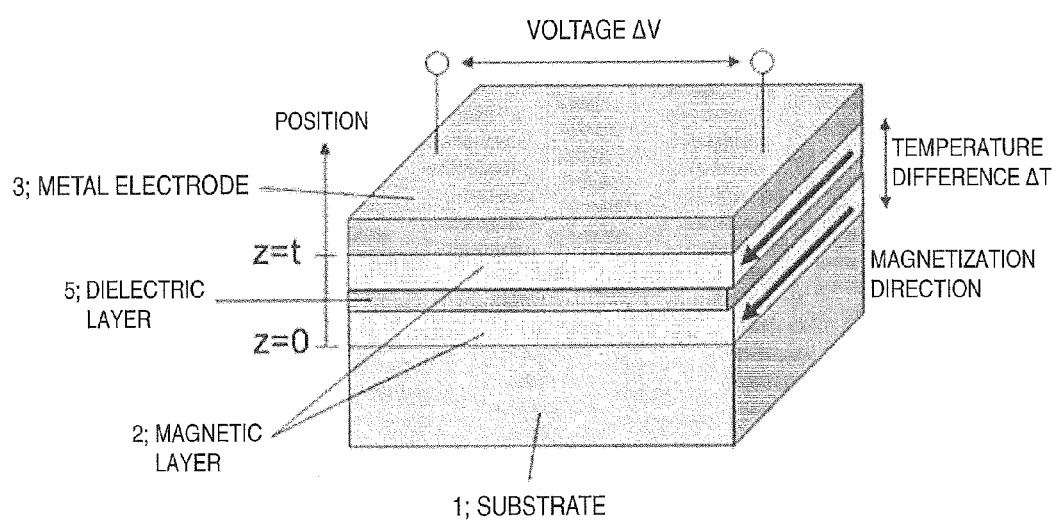
FIG. 16 is a diagram illustrating one example of an arrangement of a sixth exemplary embodiment of the present disclosure.

In the above-mentioned exemplary embodiment, the gap 4 may be replaced with a dielectric layer. FIG. 16 is a diagram (perspective view) illustrating schematically one example of an arrangement of a sixth embodiment of the present disclosure. In the sixth exemplary embodiment of the present disclosure, a dielectric layer (non-magnetic dielectric layer) 5 with a low thermal conductivity is provided between two layers of the magnetic layer 2. Thus, as with the gap in the above-mentioned exemplary embodiments, the gap suppresses a thermal conductivity by phonon, and yet permits propagation of magnons by a magnetic dipole interaction, thereby enabling an improvement of a thermoelectric performance index.

For example, organic polymer is used as the non-magnetic dielectric layer with a low thermal conductivity. By using an uncrystallized film such as a polymer, a thermal conductivity can be reduced. By using an organic material with a small mass density, a mismatch of an acoustic impedance at the interface for the magnetic layer is enhanced, thereby enabling a further suppression of a phonon conduction.

Example 6

Figure 17:
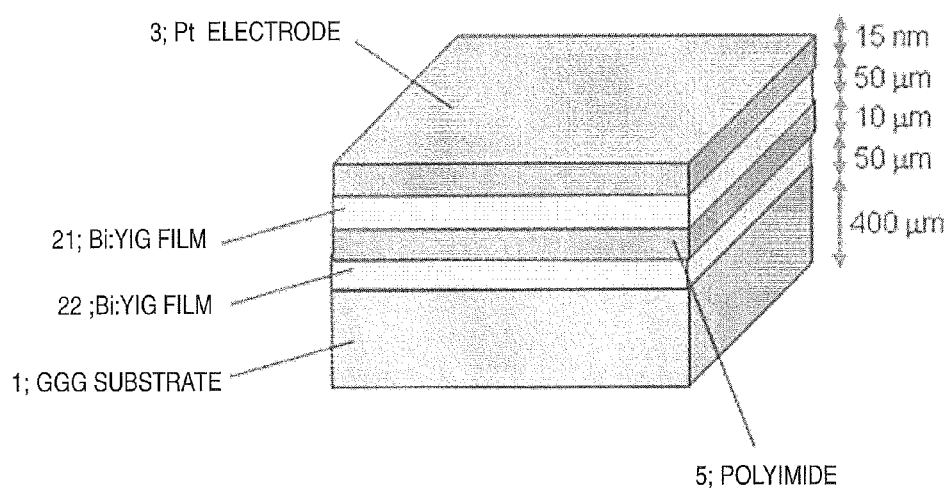
FIG. 17 is a diagram illustrating one specific example (Example 6) of the sixth exemplary embodiment.

FIG. 17 is a diagram (perspective diagram) illustrating a specific example (Example 6) of a sixth embodiment of the sixth exemplary embodiment of the present disclosure.

In FIG. 17, a gadolinium gallium garnet (GGG) substrate with a thickness of 400 μm is used as the substrate 1;

Bi-doped YIG (Bi:YIG, composition $BiY_2Fe_5O_{12}$) thin films with a thickness of 50 μm are used as the lower magnetic layer 22 and the upper magnetic layer 21;

Pt with a thickness of 15 nm is used as the metal electrode 3; and a polyimide with a thickness of 10 μm is used as the dielectric layer 5. In the present example, a fabrication method similar to that of Example 1 as illustrated in FIG. 4 is used.

Seventh Exemplary Embodiment

Figure 18:
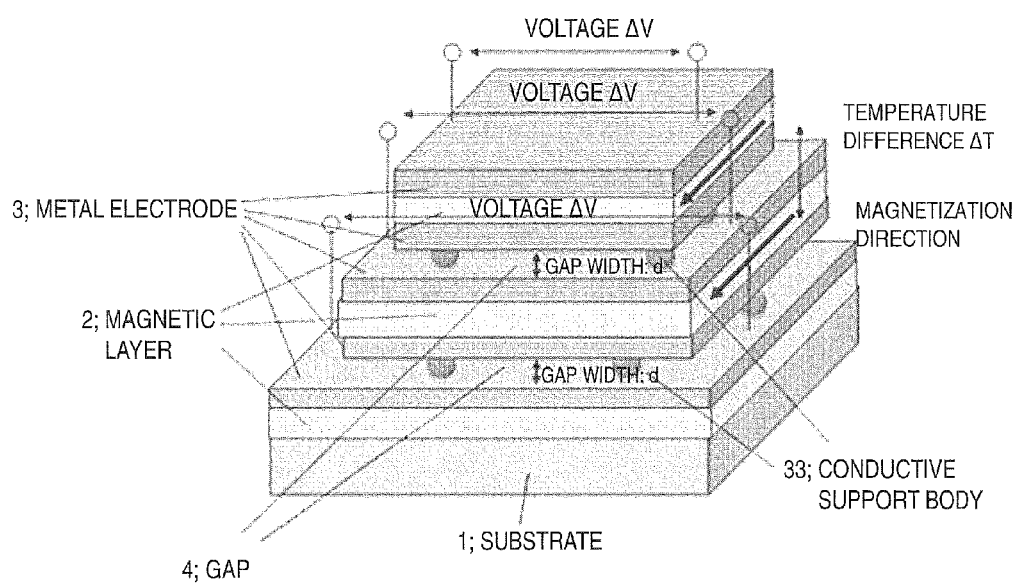
FIG. 18 is a diagram illustrating one example of an arrangement of a seventh exemplary embodiment of the present disclosure.

FIG. 18 is a diagram (perspective diagram) illustrating schematically one example of an arrangement of a seventh exemplary embodiment of the present disclosure. FIG. 18 illustrates an arrangement of multi-layer type thermoelectric conversion device by a perspective view. The present embodiment has a structure in which a power generation unit is multi-layered in the fifth exemplary embodiment. The thermoelectric conversion device comprises a magnetic layer 2 on the substrate 1; a metal electrode 3 on the magnetic layer 2. On the metal electrode 3, a plurality of magnetic layers 2 with metal electrodes 3 provided on the both surfaces thereof are stacked via gaps 4 with a predetermined width (d), respectively. As described above, by using a structure including a plurality of magnetic layers 2, and a plurality of metal electrodes 3, it is possible to generate a thermal electromotive force effectively, thereby enabling a high efficiency thermoelectric power generation from a temperature gradient. It is noted that in the present embodiment, any one of arrangements (power generation unit 20) described in the first to sixth exemplary embodiments may be used as the arrangement of the power generation unit.

As described in each of the exemplary embodiments, with a gap or a dielectric layer with a low thermal conductivity is provided between the first and the second magnetic layers, a thermal conduction by phonon in the direction of a thermal gradient is suppressed to reduce a thermal conductivity κ of the device, whereas since a spin flow carried by magnons propagates through the gap due to a magnetic dipole interaction, a thermoelectric performance S does not change so much. As the result, a large performance index can be obtained.

INDUSTRIAL APPLICABILITY

A thermoelectric conversion device may be used for the purpose of high efficiency energy use in a low carbon society and power feeding to a ubiquitous terminal, a sensor and so forth.

The disclosures of the above-mentioned Patent Literatures and Non-Patent Literatures are incorporated herein in their entireties by reference thereto. The exemplary embodiments and examples may include variations and modifications without departing the gist and scope of the present invention as disclosed herein and claimed as appended herewith, and furthermore based on the fundamental technical spirit. It should be noted that any combination and/or selection of the disclosed elements may fall within the claims of the present invention. That is, it should be noted that the present invention of course includes various variations and modifications that could be made by those skilled in the art according to the overall disclosures including claims and technical spirit.

The above-mentioned exemplary embodiments may be described as the following supplementary notes, however, not limited to them.

(Supplementary Note 1)
A thermoelectric conversion device, comprising:
a first magnetic layer and a second magnetic layer spaced by a predetermined gap along a surface-normal direction thereof; and
a first electrode including a material having a spin orbit interaction, the first electrode arranged in contact with one surface of at least one of the first and the second magnetic layers, the first and the second magnetic layers each having a magnetization direction substantially perpendicular to a direction of electromotive force generated on the first electrode, the electromotive force corresponding to a temperature difference between the first magnetic layer and the second magnetic layer along the surface-normal direction being extracted from the first electrode.

(Supplementary Note 2)
The thermoelectric conversion device according to supplementary note 1, comprising: a plurality of support bodies, each arranged at a gap between the first and the second magnetic layers.

(Supplementary Note 3)
The thermoelectric conversion device according to supplementary note 2, wherein the support body include a magnetic material having magnetization.

(Supplementary Note 4)
The thermoelectric conversion device according to supplementary note or 3, wherein the support body has at least one of shapes: polyhedron including substantially columnar or acute-angled portion, sphere, and spheroid.

(Supplementary Note 5)
The thermoelectric conversion device according to any one of supplementary notes 1 to 4, wherein the gap between the first and the second layers is vacuum-sealed.

(Supplementary Note 6)
The thermoelectric conversion device according to supplementary note 1, comprising a non-magnetic dielectric layer between the first and the second magnetic layers.

(Supplementary Note 7)
The thermoelectric conversion device according to any one of supplementary notes 1 to 6, wherein the first and the second magnetic layers each include a magnetic insulator.

(Supplementary Note 8)
The thermoelectric conversion device according to any one of supplementary notes 1 to 7, wherein the first and the second magnetic layers each have a coercive force with respect to a magnetization characteristic substantially perpendicular to the direction of the electromotive force induced in the first electrode.

(Supplementary Note 9)
The thermoelectric conversion device according to any one of supplementary notes 1 to 8, wherein the predetermined gap is smaller than or equal to a maximum propagation distance exerted by a magnetic dipole interaction of magnons between the first and the second magnetic layers.

(Supplementary Note 10)
The thermoelectric conversion device according to any one of supplementary notes 1 to 8, wherein the predetermined gap is larger than or equal to 10 μm and smaller than or equal to 100 μm.

(Supplementary Note 11)
The thermoelectric conversion device according to any one of supplementary notes 1 to 9, comprising:
the first electrode arranged in contact with the one surface of the first magnetic layer, the one surface being opposite to a surface of the first magnetic layer on the second magnetic layer side; and
a second electrode including a material having a spin orbit interaction, the second electrode arranged in contact with a surface of the second magnetic layer on the first magnetic layer side, the second electrode and the first magnetic layer spaced to each other by the predetermined gap.

(Supplementary Note 12)
The thermoelectric conversion device according to any one of supplementary notes 1 to 9, comprising:
the first electrode arranged in contact with the one surface of the first magnetic layer, the one surface being opposite to a surface of the first magnetic layer on the second magnetic layer side; and
a second electrode including a material having a spin orbit interaction, the second electrode arranged in contact with a surface of the second magnetic layer on the first magnetic layer side; and
a third electrode including a material having a spin orbit interaction that is disposed in contact with a surface of the first magnetic layer on the second magnetic layer side, the second and the third electrodes spaced to each other by the predetermined gap.

(Supplementary Note 13)
The thermoelectric conversion device according to any one of supplementary notes 1 to 9, wherein the first and the second magnetic layers are provided on a substrate.

(Supplementary Note 14)
A thermoelectric conversion device, comprising:
a substrate;
a first magnetic layer disposed on the substrate;
a first conductive member disposed on the first magnetic layer; and
one or a plurality of laminated body(s), each including a conductive member, a magnetic layer, and a conductive member,
the first conductive member and the laminated body being spaced to each other by a predetermined gap,
the laminated bodies being spaced to each other by a predetermined gap,
the magnetic layer having a magnetization direction substantially perpendicular to an in-plane direction of an electromotive force,
the electromotive force being extracted from a topmost layer among the conductive members by a temperature difference between the first magnetic layer on the substrate and the magnetic layer of the laminated body in a surface-normal direction.

(Supplementary Note 15)
A thermoelectric conversion method, comprising:
disposing the first and the second magnetic layers spaced to each other by a predetermined gap;
disposing a first electrode including a material having a spin orbit interaction in contact with at least one of the first and the second magnetic layers, the first and the second magnetic layers each having a magnetization direction substantially perpendicular to a direction of an electromotive force induced in the first electrode, respectively; and
extracting the electromotive force corresponding to a temperature difference between the first and second magnetic layers in a direction perpendicular to surfaces of the first and the second magnetic layers, from the first electrode.

(Supplementary Note 16)
The thermoelectric conversion method according to supplementary note 15, wherein a plurality of support bodies are provided at a gap between the first and the second magnetic layers.

(Supplementary Note 17)
The thermoelectric conversion method according to supplementary note 15, wherein the support bodies include magnetic material having magnetization.

(Supplementary Note 18)
The thermoelectric conversion method according to supplementary note 15 or 16, wherein the support bodies have at least one of shapes: polyhedron including substantially columnar or acute-angled portion, sphere, and spheroid.

(Supplementary Note 19)
The thermoelectric conversion method according to any one of supplementary notes 15 to 18, wherein a gap between the first and the second magnetic layers is vacuum-sealed.

(Supplementary Note 20)
The thermoelectric conversion method according to supplementary note 15, comprising a non-magnetic dielectric layer between the first and the second magnetic layers.

(Supplementary Note 21)
The thermoelectric conversion method according to any one of supplementary notes 15 to 20, wherein the first and the second magnetic layers include magnetic insulator.

(Supplementary Note 22)
The thermoelectric conversion method according to any one of supplementary notes 15 to 21, wherein the first and the second magnetic layers have coercive force with respect to a magnetization characteristic substantially perpendicular to a direction of electromotive force caused in the first electrode.

(Supplementary Note 23)
The thermoelectric conversion method according to any one of supplementary notes 15 to 22, wherein the predetermined gap is smaller than or equal to a maximum propagation distance exerted by magnetic dipole interaction of magnons between the first and the second magnetic layers.

(Supplementary Note 24)
The thermoelectric conversion method according to any one of supplementary notes 15 to 23, wherein the predetermined gap is larger than or equal to 10 μm, and smaller than or equal to 100 μm.

(Supplementary Note 25)
The thermoelectric conversion method according to any one of supplementary notes 15 to 24, providing:
the first electrode that is disposed in contact with the one surface opposite to a surface of the first magnetic layer on the second magnetic layer side; and
a second electrode including a material having a spin orbit interaction that is disposed in contact with a surface of the second magnetic layer on the first magnetic layer side, the second electrode and the first magnetic layer being spaced to each other by the predetermined gap.
(Supplementary Note 26)
The thermoelectric conversion method according to any one of supplementary notes 15 to 24, providing:
the first electrode that is disposed in contact with the one surface opposite to a surface of the first magnetic layer on the second magnetic layer side;
a second electrode including a material having a spin orbit interaction that is disposed in contact with a surface of the second magnetic layer on the first magnetic layer side; and
a third electrode including a material having a spin orbit interaction that is disposed in contact with a surface of the first magnetic layer on the second magnetic layer side,
the second electrode and the third electrode being spaced to each other by the predetermined gap.
(Supplementary Note 27)
A method for manufacturing a thermoelectric conversion device, comprising:
(a) forming a lower magnetic layer on a substrate;
(b) forming a plurality of props in a matrix form on the lower magnetic layer;
(c) forming a sacrificed layer among the props on the lower magnetic layer;
(d) forming an upper magnetic layer on the props and the sacrificed layer;
(e) forming a conductive member having a spin orbit interaction on the upper magnetic layer; and
(f) removing the sacrificed layer between the lower and upper magnetic layers, while the props being remained.
(Supplementary Note 28)
A method for manufacturing a thermoelectric conversion device, comprising:
(a) dispersing props on a lower magnetic layer that has been film-formed on a substrate;
(b) apart from (a), forming a conductive member having a spin orbit interaction on an upper magnetic layer;
(c) laminating the lower magnetic layer and the upper magnetic layer respectively formed in the (a), (b) via the supports; and
(d) bonding a gap between the lower magnetic layer and the upper magnetic layer by an adhesion member.

REFERENCE SIGNS LIST 1 substrate
2 magnetic layer
3 metal electrode
4 gap
10 support structure
11 sacrificed layer
12 adhesion means
13 metal electrode
14 metal electrode
20 power generation unit
21 upper magnetic material unit
22 lower magnetic material unit
31 support spherical body
32 magnetic support body
33 conductive support body

What is claimed is:
1. A thermoelectric conversion device comprising:
a first magnetic layer and a second magnetic layer stacked with a surface-normal direction related to a top surface of the first magnetic layer, the first and the second magnetic layers including an oxide magnetic material comprising one of a garnet ferrite and a spinel ferrite, the first and the second magnetic layers each having a magnetization direction substantially in a plane direction thereof and parallel each other;
a gap provided between the top surface of the first magnetic layer and a bottom surface of the second magnetic layer; and
a first electrode including a material having a spin orbit interaction, the first electrode arranged in contact with a top surface of the second magnetic layer.

2. The thermoelectric conversion device according to claim 1, further comprising a plurality of support bodies, each of the support bodies arranged in the gap between the first and the second magnetic layers.

3. The thermoelectric conversion device according to claim 2, wherein the support body comprises at least one of:
a polyhedron shape including columnar or acute-angled portion;
a sphere shape; and
a spheroid shape.

4. The thermoelectric conversion device according to claim 1, wherein the gap between the first and the second layers is vacuum-sealed.

5. The thermoelectric conversion device according to claim 1, further comprising
a non-magnetic dielectric layer filling the gap between the first and the second magnetic layers.

6. The thermoelectric conversion device according to claim 1, wherein the first and the second magnetic layers each have a coercive force with respect to a magnetization characteristic substantially perpendicular to a direction of the electromotive force induced in the first electrode.

7. The thermoelectric conversion device according to claim 1, wherein the gap is set to a distance suppressing phonon thermal conduction between the first and second magnetic layers, while not suppressing a spin flow propagation through the gap between the first and second magnetic layers.

8. The thermoelectric conversion device according to claim 1, having, as the first electrode, a single layer of a metal film arranged in contact with the second magnetic layer.

9. The thermoelectric conversion device according to claim 1, wherein a surface area of the top surface of the first magnetic layer is different than a surface area of the bottom surface of the second magnetic layer.

10. The thermoelectric conversion device according to claim 1, further comprising a support body arranged in the gap between the first and the second magnetic layers.

11. The thermoelectric conversion device according to claim 1, wherein a width of the gap is set such that a thermal conductance per unit area of the gap is less than or equal to 3 kW/K.

12. The thermoelectric conversion device according to claim 1, wherein a surface area of the top surface of the first magnetic layer is greater than a surface area of the bottom surface of the second magnetic layer.

13. The thermoelectric conversion device according to claim 1, further comprising an electrode layer disposed on the first magnetic layer such that the gap is provided between a top surface of the electrode layer and the bottom surface of the second magnetic layer.

14. The thermoelectric conversion device according to claim 13, wherein a thickness of the electrode layer is less than a thickness of the first magnetic layer.

15. A thermoelectric conversion device comprising:
a first magnetic layer and a second magnetic layer stacked with a surface-normal direction related to a top surface of the first magnetic layer, the first and the second magnetic layers including an oxide magnetic material comprising one of a garnet ferrite and a spinel ferrite, the first and the second magnetic layers each having a magnetization direction substantially in plane direction thereof and parallel each other;

a gap provided between the top surface of the first magnetic layer and a bottom surface of the second magnetic layer;

a first electrode including a material having a spin orbit interaction, the first electrode arranged in contact with a top surface of the second magnetic layer; and a plurality of support bodies, each of the support bodies arranged in the gap between the first and the second magnetic layers, wherein the support body includes a magnetic material having a magnetization.

16. A thermoelectric conversion device comprising:

a first magnetic layer and a second magnetic layer stacked with a surface-normal direction related to a top surface of the first magnetic layer, the first and the second magnetic layers including an oxide magnetic material comprising one of a garnet ferrite and a spinel ferrite, the first and the second magnetic layers each having a magnetization direction substantially in plane direction thereof and parallel each other;

a gap provided between the top surface of the first magnetic layer and a bottom surface of the second magnetic layer;

a first electrode including a material having a spin orbit interaction, the first electrode arranged in contact with a top surface of the second magnetic layer, wherein the gap is smaller than or equal to a maximum propagation distance by a magnetic dipole interaction of magnons between the first and the second magnetic layers.

17. A thermoelectric conversion device comprising:

a first magnetic layer;

a first electrode including a material having a spin orbit interaction, the first electrode arranged in contact with a top surface of the first magnetic layer;

a second electrode arranged to have a bottom surface thereof opposed to a top surface of the first electrode with a gap provided between the top surface of the first electrode and the bottom surface of the second electrode;

a second magnetic layer arranged in contact with a top surface of the second electrode, the second magnetic layer being stacked in a surface-normal direction related to a top surface of the first magnetic layer, the first and the second magnetic layers each including an oxide magnetic material comprising one of a garnet ferrite and a spinel ferrite, the first and the second magnetic layers each having a magnetization direction substantially in plane direction thereof and parallel each other; and a third electrode including a material having a spin orbit interaction, the third electrode being arranged in contact with a top surface of the second magnetic layer.

18. The thermoelectric conversion device according to claim 17, wherein an electromotive force is extracted from the third electrode.

19. A thermoelectric conversion device comprising:

a first magnetic layer;

a first electrode including a material having a spin orbit interaction, the first electrode being arranged in contact with a top surface of the first magnetic layer;

a second magnetic layer arranged to have a bottom surface thereof opposed to a top surface of the first electrode with a gap provided between the top surface of the first electrode and the bottom surface of the second magnetic layer, the second magnetic layer being stacked in a surface-normal direction related to a top surface of the first magnetic layer, the first and the second magnetic layers each including an oxide magnetic material comprising one of a garnet ferrite and a spinel ferrite, the first and the second magnetic layers each having a magnetization direction substantially in plane direction thereof and parallel each other; and a second electrode arranged in contact with a top surface of the second magnetic layer.

* * * * *